(12) United States Patent
Doran et al.

(10) Patent No.: US 6,301,517 B1
(45) Date of Patent: *Oct. 9, 2001

(54) AUTOMATED TEST POSITION MONITORING AND NOTIFICATION SYSTEM

(75) Inventors: Patrick J. Doran, Whitehall; Daniel Kern, Sinking Spring, both of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/266,223

(22) Filed: Mar. 10, 1999

(51) Int. Cl.$^7$ .................................................. G06F 19/00
(52) U.S. Cl. .......................................... 700/110; 324/755
(58) Field of Search ................... 700/110; 324/754–758, 324/538, 760, 158.1; 702/59, 62, 116–117, 118

(56) References Cited

U.S. PATENT DOCUMENTS

| | | | | |
|---|---|---|---|---|
| 3,667,045 | * | 5/1972 | Combs ................................. | 455/90 |
| 5,159,266 | * | 10/1992 | Appold ................................. | 324/537 |
| 5,481,203 | * | 1/1996 | Appold ................................. | 324/755 |
| 5,578,370 | * | 11/1996 | Farnsworth et al. ................. | 257/727 |
| 5,760,595 | * | 6/1998 | Edwards et al. ..................... | 327/703 |
| 5,862,146 | * | 1/1999 | Chen et al. ........................... | 714/718 |
| 5,926,027 | * | 7/1999 | Bumb, Jr. et al. ................... | 324/755 |
| 6,005,385 | * | 12/1999 | Ping ..................................... | 324/158.1 |
| 6,118,291 | * | 9/2000 | Martin et al. ........................ | 324/755 |
| 6,168,449 | * | 1/2001 | Huang et al. ........................ | 439/259 |
| 6,208,156 | * | 3/2001 | Hembree .............................. | 324/755 |
| 6,220,870 | * | 4/2001 | Barabi et al. ........................ | 439/71 |

* cited by examiner

*Primary Examiner*—William Grant
*Assistant Examiner*—Ronald D Hartman, Jr.
(74) *Attorney, Agent, or Firm*—Wendy W. Koba, Esq.

(57) ABSTRACT

An automated monitoring and notification system for use with a testing arrangement is able to identify "potentially faulty test sockets". The system uses a set of pre-existing data contained in a manufacturing database regarding the number of device failures for each socket. A threshold number of consecutive device failures is used to flag a particular test socket as "suspect". Another database, containing historical "failure" data for the test sockets is then queried upon identification of each "suspect". When the number of "failures" for a "suspect" exceeds a predetermined threshold, the socket is identified as "potentially faulty" and an alarm is sent to the system user.

23 Claims, 5 Drawing Sheets

FIG. 7

| SOCKET NUMBER | TOTAL FAILURES IN 14 DAYS |
|---|---|
| 1-1-2-18 | 10 |
| 3-2-2-23 | 10 |
| 15-2-1-26 | 9 |
| 1-1-1-40 | 9 |
| 6-2-1-31 | 9 |
| 15-2-1-49 | 8 |
| 1-2-2-41 | 8 |
| 9-2-1-3 | 8 |
| 2-1-1-22 | 7 |
| 13-1-1-29 | 7 |
| 16-1-1-28 | 6 |
| 16-1-2-21 | 6 |
| 16-2-2-12 | 6 |
| 1-1-1--35 | 6 |
| 4-2-2-16 | 6 |
| 16-2-2-7 | 6 |
| 16-2-2-37 | 6 |
| 15-1-2-50 | 5 |
| 1-2-1-41 | 5 |
| 2-2-1-41 | 5 |
| 6-2-2-38 | 5 |
| 2-2-2-1 | 4 |
| 13-1-2-36 | 4 |
| 16-2-1-43 | 4 |
| 15-1-1-3 | 4 |
| 16-1-1-48 | 4 |
| 17-1-1-15 | 4 |
| 2-1-1-5 | 3 |
| 3-1-1-45 | 3 |

FIG. 8

SOCKET: 1-1-2-18

| DEVICE | DATE | STATUS | FAILURE MODE |
|---|---|---|---|
| AA-11 | 22-FEB-99 | PASS | PASS |
| AA-15 | 21-FEB-99 | PASS | PASS |
| AB-12 | 20-FEB-99 | PASS | PASS |
| AA-11 | 19-FEB-99 | PASS | PASS |
| BX-13 | 18 FEB-99 | FAIL | OPEN |
| AB-32 | 17-FEB-99 | FAIL | OPEN |
| BZ-24 | 16-FEB-99 | FAIL | OPEN |
| AA-11 | 15-FEB-99 | FAIL | OPEN |
| AA-15 | 14-FEB-99 | FAIL | OPEN |
| AB-12 | 13-FEB-99 | FAIL | OPEN |
| AA-11 | 12-FEB-99 | FAIL | OPEN |
| BX-13 | 11-FEB-99 | FAIL | OPEN |
| AB-32 | 10-FEB-99 | FAIL | OPEN |
| BZ-24 | 09-FEB-99 | FAIL | OPEN |
| AA-11 | 08-FEB-99 | FAIL | OPEN |
| AA-15 | 07-FEB-99 | FAIL | OPEN |
| AB-12 | 06-FEB-99 | FAIL | OPEN |
| BX-13 | 05 FEB-99 | FAIL | OPEN |
| AB-32 | 04-FEB-99 | FAIL | OPEN |
| BZ-24 | 03-FEB-99 | FAIL | OPEN |

AUTOMATED TEST POSITION MONITORING AND NOTIFICATION SYSTEM

BACKGROUND OF THE INVENTION

The present invention relates to an automated test position monitoring and notification system and, more particularly, to a monitoring system capable of continuously analyzing thousands of "test sockets" and notifying a system user of failures associated with the sockets.

In the manufacture of various devices, for example, electrical or optoelectronic devices, a variety of tests are performed to assess the operability of the devices. At times, multiple devices may be tested simultaneously, with a number of different test points accessed on each device. In such a situation, the multiple devices may be held in a single test fixture (each device held within a separate socket), with a set of test probes used to contact each separate device. At times, one or more sockets within the test fixture may fail the failure indicated by test results that are out of a "normal" expected range. Such a result may also occur from a malfunctioning device. Therefore, it is often difficult to ascertain the source of the failure between the test socket and the device itself. The ability to find the source of such a failure in "real time" becomes essentially impossible when thousands of devices are being tested simultaneously. As a result, "good" devices may be scrapped as "failures" when being tested in a malfunctioning socket.

At this time, manually recovered data associated with various test sockets may be used to determine the site of "failed" sockets. However, by the time this data is collected and analyzed, many devices may have already been loaded and tested in one or more failed sockets.

Thus, a need remains for a system capable of quickly realizing the location of failed test sockets and alerting user to remove the socket from the test fixture or repair the same.

SUMMARY OF THE INVENTION

The need remaining in the prior art is addressed by the present invention, which relates to an automated test position monitoring and notification system and, more particularly to a monitoring system capable of continuously analyzing thousands of "test sockets" and notifying a system user of failures associated with failed sockets.

In accordance with the present invention a monitoring system includes a manufacturing database, a failure summary database, and a monitoring program. The monitoring program is used to establish a "suspect threshold" for the sockets within the test arrangement (for example, three consecutive "device failures" in a given socket). As the testing process is taking place, the test data is stored in the manufacturing database. The monitoring program continuously queries the monitoring database, looking for "suspect" sockets. When such sockets are identified, the monitoring program then queries the "failure summary database" for long-term information (for example, a month's worth of data) regarding that particular socket. If the total number of failures over the longer time period exceeds a predefined threshold, an "alarm" is posted to identify the potentially faulty socket.

In a preferred embodiment, the monitoring program is capable of sending an "alarm" message to the proper user using e-mail, paging, etc. In this embodiment, a failed socket may be quickly repaired and returned to service. Advantageously, the monitoring program can be altered as different users are responsible for overseeing the testing process.

An additional feature of the present invention is the inclusion of a web-based browser allowing access to socket data from virtually anywhere via an HTML viewer, such as Netscape. A CGI/web-based application provides a prioritized list of problem sockets upon request such that any "suspect" socket can then be retrieved and the historical data associated with the socket viewed on-line.

Other and further embodiments of the present invention will become apparent during the course of the following discussion and by reference to the accompanying drawings.

BRIEF DESCRIPTION OF THE DRAWINGS

Referring now to the drawings where like numerals represent like parts in several views:

FIG. 7 is an exemplary table illustrating a set of potentially faulty sockets as detected by the monitoring system of the present invention; and FIG. 8 is an exemplary table of a detailed "history" of one of the potentially faulty sockets of FIG. 7, the historical data taken from the failure summary database.

DETAILED DESCRIPTION

Figure 1:
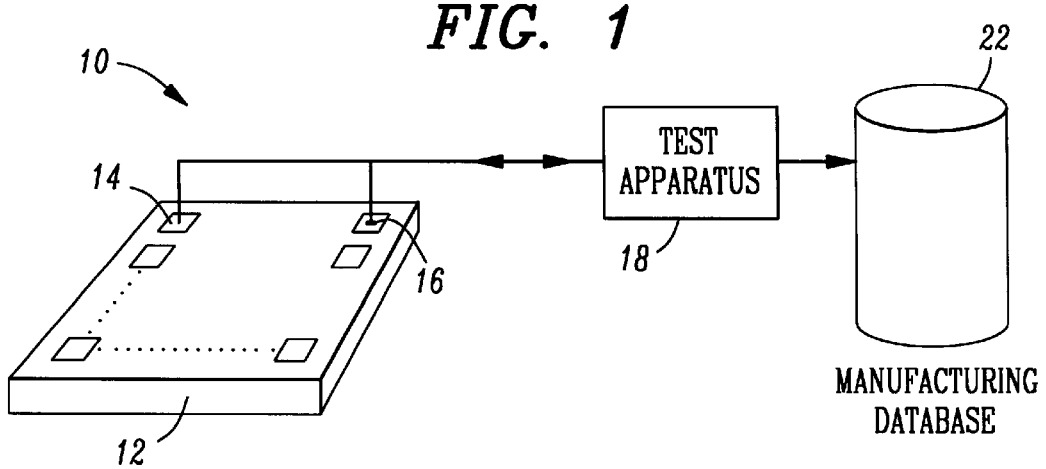
FIG. 1 illustrates an exemplary test arrangement, including a conventional fixture for simultaneously testing a plurality of devices.

FIG. 1 illustrates a portion of a testing arrangement 10 which may use the monitoring and notification system of the present invention. Illustrated in FIG. 1 is an exemplary test fixture 12 containing a plurality of test sockets 14, each socket 14 for supporting a separate device 16 to be tested. As mentioned above, the type of device being tested may be an electronic device, an optoelectronic device, or an appropriate combination of devices forming a subassembly. In general, the type of device being tested is not germane to the subject matter of the present invention. Associated with arrangement 10 is a test apparatus 18, including a number of separate probes 20, each probe for contacting a separate one of the devices 16 and collecting data regarding the performance of device 16. For some complicated devices (such as subassemblies), five or more separate test points may be contacted on each device. Therefore, presuming that there are fifty devices being tested, and each device contains five test points, a total of 250 data points are collected with respect to fixture 12. This test data is then stored in a manufacturing database 22.

Figure 2:
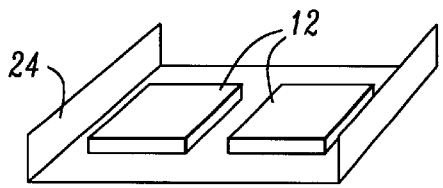
FIG. 2 illustrates an exemplary test panel, used to support a pair of test fixtures.
Figure 3:
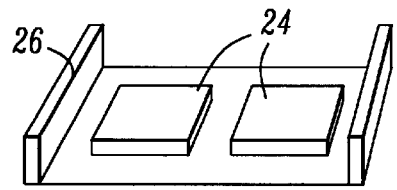
FIG. 3 illustrates an exemplary test rack, used to support a pair of test panels.
Figure 4:
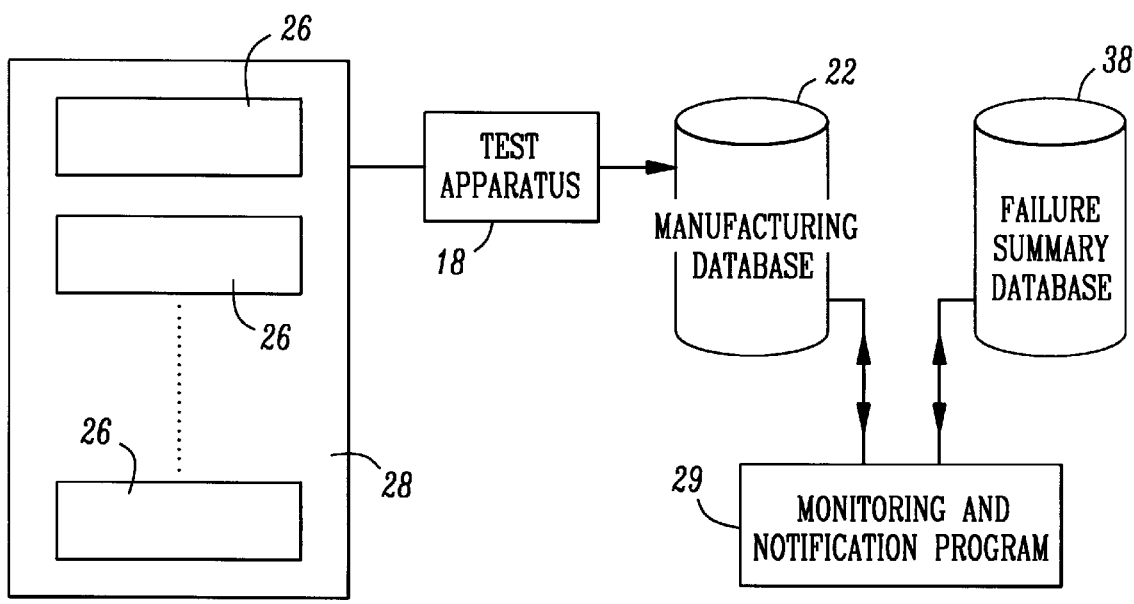
FIG. 4 illustrates an exemplary test structure, used to support a plurality of test racks.

In most test arrangements, more than one fixture is being subjected to the testing conditions. As shown in FIG. 2, an exemplary test panel 24 may be formed to support a pair of test fixtures 12. Therefore (continuing with the presumption of 50 sockets per fixture and 5 test points per socket), a total of 500 data points are collected and stored in manufacturing database 22 for each panel in the test system. Referring to FIG. 3, a test rack 26 is formed to support a pair of test panels 24. A complete test system 28, as shown in FIG. 4 may house as many as, for example, 20 separate test racks. During one test cycle, therefore, an exemplary test system 28 would collect 20,000 pieces of data to be stored in manufacturing database 22. As mentioned above, a difficulty with monitoring such a system in the prior art is the ability to determine the presence of a "faulty" socket, as opposed to a "faulty" device in a timely manner so as not to scrap good devices.

Figure 5:
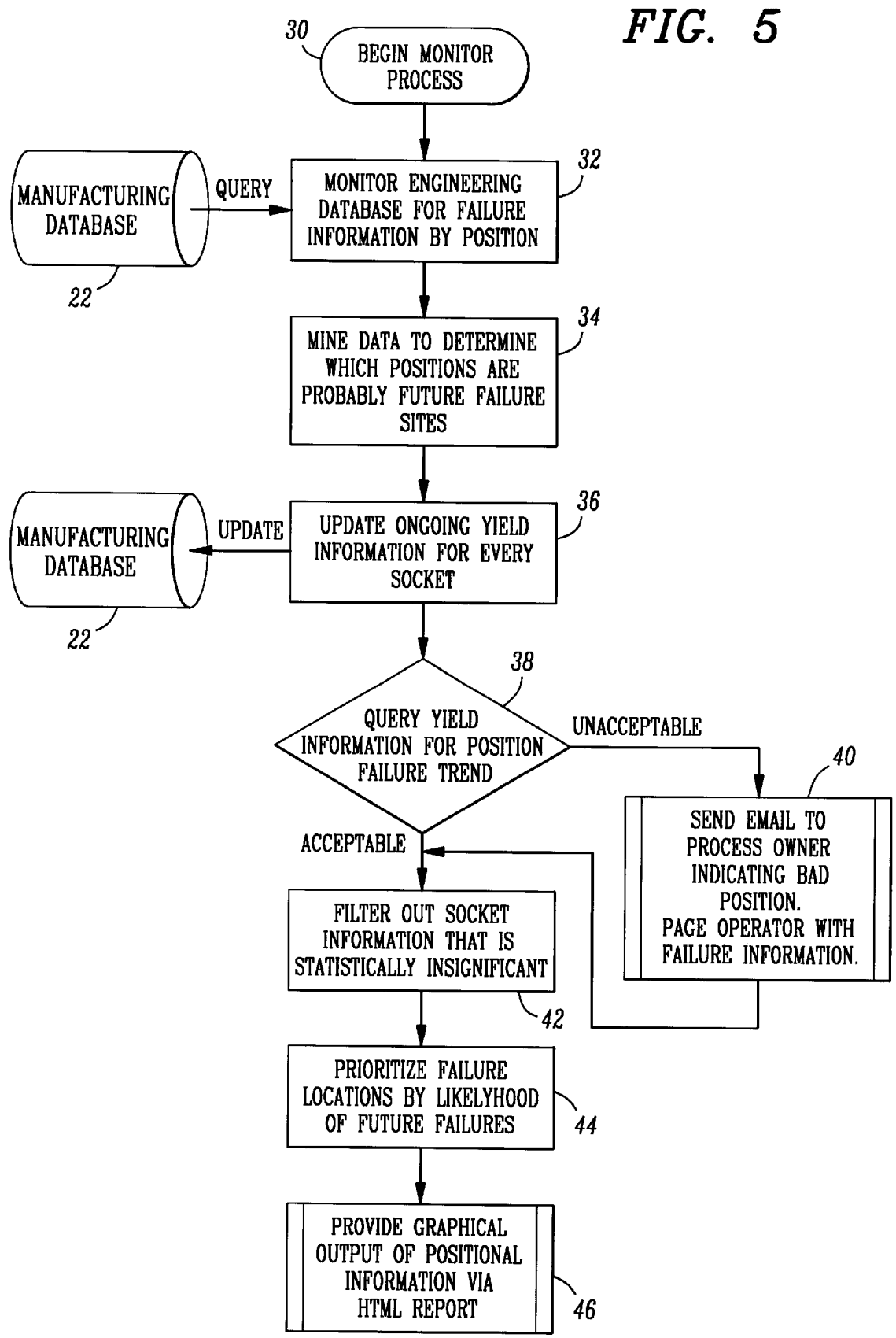
FIG. 5 contains a flow chart illustrating the monitoring and notification system of the present invention.

In accordance with the present invention, a monitoring and notification system has been developed to detect the presence of potentially faulty sockets within a test system and notify the proper user of the location of these sockets. As shown in FIG. 4 and discussed in detail below in association with FIGS. 5 and 6, the system of the present invention uses the manufacturing database 18, a failure summary database 38 (discussed below) and a monitoring and notification program 29. The system is best understood by way of the following flow charts. In particular, FIG. 5 includes a flow chart illustrating the monitoring and notification system of the present invention. The system is initialized at step 30, which sets parameters such as a threshold level for "suspect" test sockets within the monitoring and notification program 29. For example, if a particular test socket fails three devices in a row, it may be defined as "suspect". Another threshold level may be live failures in a row. In general, the "suspect" threshold level is set by the system user and, moreover, may be changed or modified at any time by the system user. With the threshold level set, the monitoring process, as indicated by step 32, then queries manufacturing data base 22, reviewing the most recent data associated with each socket in sequence. In one embodiment, manufacturing data base 22 may retain three days' worth of data for each socket (or, for example, four or five days' worth). Since this query of manufacturing data base 22 must be relatively fast and efficient, a large amount of data for each socket is not retained. As this data is being retrieved, the "failure rate" at each test socket is reviewed against the predefined threshold, as indicated by step 34. During this monitoring and notification process, additionally arriving data is constantly being added to manufacturing data base to update its records, as indicated by step 36.

An exemplary test cycle may run for twelve hours, resulting in two complete data-gathering cycles to be completed each day. This cycle time results in an extremely large body of data be gathered at a relatively quickly rate. Using the numbers discussed above, for example, a single day's worth of testing would result in 40,000 data items to be stored. Since the system of the present invention may be used in many different testing environments, this volume of data is exemplary only; other scenarios may require the capture and retention of even larger volume of data.

Once a particular socket is identified as "suspect", the monitoring system of the present invention sends a query to a failure summary database 38 to search for additional information regarding the failed socket. Failure summary database 38 contains historical "failure" information for each socket, for example, failure data for the past month related to each socket. If a predetermined failure threshold is exceeded upon this review (for example, 10 failures in the past 14 days), the monitoring system of the present invention will send an alarm to system user, as indicated at step 40 in FIG. 5. The alarm may take the form of an e-mail or page to a system user, the message containing the identity of the potentially faulty socket (the "identity", as will be discussed below, may be defined by a numerical designation of the "socket-fixture-panel-rack").

As long as the historical data does not indicate the presence of a potentially faulty socket (or after an alarm has been sent in the situation where a potentially faulty socket is identified), any insignificant socket information may be filtered out, as indicated at step 42. The remaining data may then be prioritized, as indicated at step 44 and used to provide graphical output data to the system user, shown as step 46. In this fashion, "potential" faulty locations may be identified early and reviewed before a problem occurs.

Figure 6:
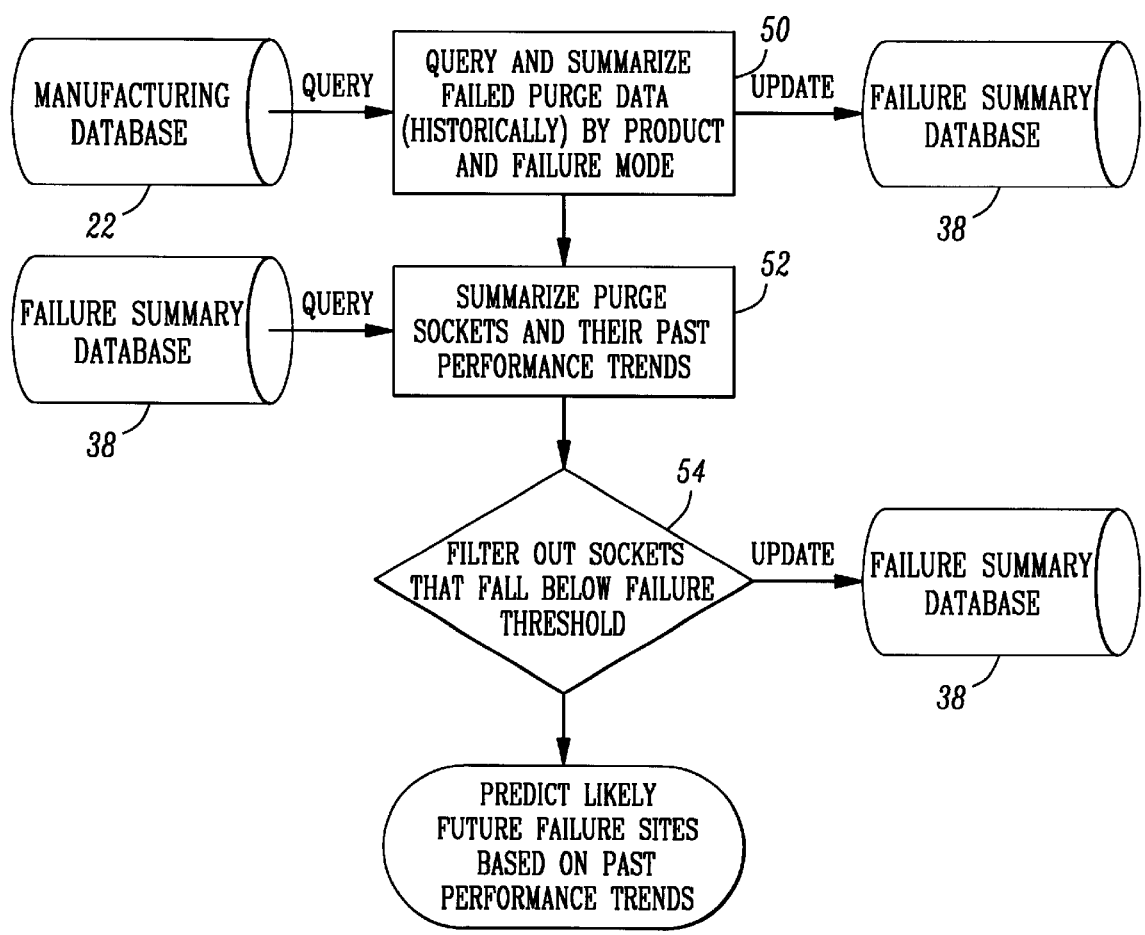
FIG. 6 contains a second flow chart, illustrating an exemplary system for evaluating test data contained within the manufacturing data base.

FIG. 6 illustrates an exemplary "data mining" process that may be used with the monitoring system of the present invention. As shown, all failure data in the manufacturing data base is captured at step 50 of the process, and forwarded to failure summary database 38, where it will be stored for the predetermined length of time (for example, storing a months worth of failure data for each socket). Using a particular "failure" threshold, such as more than five failures in the past ten days, failure summary database 38 can be queried, as indicated at step 52, to identify the sockets with the highest number of failures. Step 54 is then used to filter out those sockets that fall below the predetermined threshold, where this information is used to update failure summary database 38. As mentioned above, this data may be used to "predict" the status of the test sockets and allow for the sockets to be quickly replaced or repaired.

FIG. 7 contains a read-out of test data related to "socket failures" in an exemplary system, where this read-out is typical of a report that can be accessed via an HTML browser. The data is printed out in rank order of "most failures" to "least failures". The exemplary report as shown in FIG. 7 contains failures for the past 14 days, where this time period should be considered as exemplary only. An advantage of the HTML-based report as shown is that any desired socket number can then be immediately accessed and its historical data reviewed, as shown in FIG. 8. FIG. 8 contains a chart illustrating this historical data of a particular socket, in this case, socket 1-1-2-18 (i.e., the first socket in the first fixture of the second panel in the eighteenth rack). Since this socket has experiences a significant number of failures in the past 14 days, an alarm will be sent to the system user, identifying socket 1-1-2-18 as a "potentially faulty" socket. As mentioned above, the alarm notification may take the form of, for example, an e-mail message to the appropriate user. Alternatively, the alarm may use a paging system to notify the user in an expedited fashion. In general, any system for notifying the system administration user may be used and is considered to fall within the spirit and scope of the present invention.

What is claimed is:

1. In an arrangement for electronically testing a plurality of devices, each device held in a separate test socket, a method of identifying failed sockets, the method comprising the steps of:

a) assigning unique address identifiers to each test socket in the arrangement;

b) determining a predefined number of testing failures to use as a "suspect" socket threshold;

c) determining a predefined number of testing failures to use to identify a "potentially faulty" socket;

d) providing a manufacturing database of short term failure information for each socket, said manufacturing database being constantly updated during testing;

e) providing a failure summary database of long term socket failure information;

f) querying the manufacturing database of step d) to identify "suspect" socket failures using the predefined number determined in step b);

g) for each "suspect" identified in step f), querying the failure summary database of step e) and identifying "potentially faulty" sockets using the predefined number of step c); and h) creating an alarm message for each "potentially faulty" socket identified in step g), using the predefined number determined in step c), the alarm message including the unique address identified assigned in step a).

2. The method as defined in claim 1 wherein the testing arrangement includes a plurality of testing sockets within a test fixture, a test panel including a plurality of fixtures, a test rack including a plurality of panels, said testing arrangement including a plurality of test racks, wherein in performing step a), the unique address comprises a four unit identifier, each unit associated with a separate one of a socket, fixture, panel and rack.

3. The method as defined in claim 1 wherein in performing step b), a consecutive set of failed devices is used in determining the predefined number for a "suspect" socket.

4. The method as defined in claim 1 wherein in performing step b), a consecutive set of between three and five, inclusive failed devices is used as the predefined number for a "suspect" socket.

5. The method as defined in claim 1 wherein in performing step c), a consecutive set of failed devices is used as the predefined number for a "potentially faulty" socket.

6. The method as defined in claim 1 wherein in performing step c), a consecutive set of failed devices in the range between either one and fifteen failed devices is used as the predefined number for a "potentially faulty" socket.

7. The method as defined in claim 1 wherein in performing step d), the manufacturing database maintains only three days' worth of data.

8. The method as defined in claim 1 wherein in performing step d), the manufacturing database maintains only five days' worth of data.

9. The method as defined in claim 1 wherein in performing step e), the failure summary database maintains twenty days' worth of data.

10. The method as defined in claim 1 wherein in performing step e), the failure summary database maintains one month's worth of data.

11. The method as defined in claim 1 wherein in performing step h), the alarm message is sent by e-mail.

12. The method as defined in claim 1 wherein in performing step h), the alarm message is sent by a paging system.

13. The method as defined in claim 1 wherein the method further comprises the step of:

i) creating an HTML-based data browser containing identification of "potentially faulty" sockets linked to historical data associated with each socket.

14. An arrangement for monitoring and identifying failed test sockets in a testing arrangement, the arrangement comprising a manufacturing database for storing short term data regarding device failures at each test socket;

a failure summary database for storing long term information regarding historical failures at test sockets; and a monitoring and notification system for continuously querying the manufacturing database to identify "suspect" test sockets based upon a predetermined device testing threshold and querying the failure summary database to retrieve historical failure data on each "suspect" so identified, the monitoring and notification system then defining a "potentially faulty" socket based upon the failure summary data; and alarm means for sending a "failure" message to a system user upon the identification of a potentially faulty socket.

15. An arrangement as defined in claim 14 wherein the manufacturing database stores three days' worth of data.

16. An arrangement as defined in claim 14 wherein the manufacturing database stores five days' worth of data.

17. An arrangement as defined in claim 14 wherein the failure summary database stores twenty days' worth of data.

18. An arrangement as defined in claim 14 wherein the failure summary database stores one month's worth of data.

19. An arrangement as defined in claim 14 wherein the monitoring and notification system uses a set of three consecutive device failures to define a 'suspect" threshold.

20. An arrangement as defined in claim 14 wherein the monitoring and notification system uses a set of ten consecutive device failures to define a "potentially faulty" test socket.

21. An arrangement as defined in claim 14 wherein the alarm means includes an e-mail messaging system.

22. An arrangement as defined in claim 14 wherein the alarm means includes a paging system.

23. An arrangement as defined in claim 14 wherein the arrangement further comprises an HTML-based report system including an identification of each "potentially fault" socket, linked to historical information associated with each "potentially fault" socket.

* * * * *